United States Patent
Mori et al.

(10) Patent No.: US 10,224,925 B2
(45) Date of Patent: Mar. 5, 2019

(54) COMMUNICATION NODE

(71) Applicants: DENSO CORPORATION, Kariya, Aichi-pref. (JP); SOKEN, INC., Nishio, Aichi-pref. (JP)

(72) Inventors: Hiroyuki Mori, Nishio (JP); Takuya Honda, Kariya (JP); Tomohisa Kishigami, Kariya (JP); Hirofumi Isomura, Kariya (JP)

(73) Assignees: DENSO CORPORATION, Kariya (JP); SOKEN, INC., Nishio (JP)

( * ) Notice: Subject to any disclaimer, the term of this patent is extended or adjusted under 35 U.S.C. 154(b) by 16 days.

(21) Appl. No.: 15/741,075

(22) PCT Filed: Jun. 8, 2016

(86) PCT No.: PCT/JP2016/002772
§ 371 (c)(1),
(2) Date: Dec. 29, 2017

(87) PCT Pub. No.: WO2017/051490
PCT Pub. Date: Mar. 30, 2017

(65) Prior Publication Data
US 2018/0198443 A1 Jul. 12, 2018

(30) Foreign Application Priority Data
Sep. 24, 2015 (JP) .................................. 2015-186797

(51) Int. Cl.
| H03K 17/16 | (2006.01) |
|---|---|
| H04L 25/02 | (2006.01) |
| H04L 25/12 | (2006.01) |

(52) U.S. Cl.
CPC .......... *H03K 17/164* (2013.01); *H04L 25/02* (2013.01); *H04L 25/026* (2013.01); *H04L 25/12* (2013.01); *H01L 2924/13091* (2013.01)

(58) Field of Classification Search
None
See application file for complete search history.

(56) References Cited

U.S. PATENT DOCUMENTS

| 6,731,135 B2 * | 5/2004 | Brunolli | ............. H03F 3/45179 326/30 |
|---|---|---|---|
| 7,535,258 B1 * | 5/2009 | Johnson | ............. H03F 3/45237 326/68 |

(Continued)

FOREIGN PATENT DOCUMENTS

| JP | 2009-038546 A | 2/2009 |
|---|---|---|
| WO | 2017/038592 A1 | 3/2017 |
| WO | 2017/051654 A1 | 3/2017 |

*Primary Examiner* — Minh D A
*Assistant Examiner* — James H Cho
(74) *Attorney, Agent, or Firm* — Posz Law Group, PLC

(57) ABSTRACT

A communication node is connected to a transmission line which transmits a differential signal changeable between a high level and a low level and has a high potential signal line and a low potential signal line as a pair of signal lines. The communication node includes: an inter-line potential detector that detects an intermediate potential between the pair of signal lines; a node potential detector that detects an intermediate potential of an operation power source voltage which is supplied to the communication node; and a voltage adjuster that detects a difference between the intermediate potential detected by the inter-line potential detector and the intermediate potential detected by the node potential detector, and adjusts the operation power source voltage in accordance with the difference.

3 Claims, 4 Drawing Sheets

(56) References Cited

U.S. PATENT DOCUMENTS

| | | | |
|---|---|---|---|
| 2003/0085737 A1* | 5/2003 | Tinsley | H03K 19/017527 |
| | | | 326/86 |
| 2011/0268198 A1* | 11/2011 | Nishioka | H04L 25/0272 |
| | | | 375/257 |
| 2012/0293230 A1 | 11/2012 | Mori et al. | |
| 2015/0221060 A1 | 8/2015 | Imai | |

\* cited by examiner

COMMUNICATION NODE

CROSS REFERENCE TO RELATED APPLICATIONS

This application is the U.S. national phase of International Application No. PCT/Jp2016/002772 filed on Jun. 28, 2016 and is based on Japanese Patent Application No. 2015-186797 filed on Sep. 24, 2015, the disclosure of which is incorporated herein by reference.

TECHNICAL FIELD

The present disclosure relates to a communication node connected to a transmission line for transmitting a differential signal.

BACKGROUND

When transmitting a digital signal via a transmission line, ringing, i.e., a distortion of a waveform of a signal such as overshoot or undershoot may arise on a reception side since a part of signal energy reflects when a signal level is changed. Various techniques for restricting the distortion of the waveform are conventionally proposed. For example, Patent Literature 1 discloses a technique for restricting the ringing by adjusting an impedance only in a predetermined period which does not affect communication while a voltage level in the transmission line is switched between a low level and a high level (See FIGS. 8 to 11).

In fifth embodiment of the Patent Literature 1, an element for restricting the ringing is prepared by a structure such that a N channel MOSFET and a P channel MOSFET are connected in parallel to each other between a high potential signal line and a low potential signal line. The N channel MOSFET is operated by a voltage between a power source having a voltage Vcc and the low potential signal line. The P channel MOSFET is operated by a voltage between the high potential signal line and a ground. Thus, even if an offset is generated in a ground potential at a communication node, at least one of the N channel MOSFET and the P channel MOSFET restricts the ringing.

PATENT LITERATURE

Patent Literature 1: JP-5498527-B2

SUMMARY

However, if the offset is not generated in the ground potential at the communication node, a restriction effect of the ringing may be reduced when only one of the N channel MOSFET and the P channel MOSFET functions because of occurrence of the offset, compared with a case where both of the N channel MOSFET and the P channel MOSFET function simultaneously.

It is an object of the present disclosure to provide a communication node for resolving a difference in a ground potential.

According to one aspect of the present disclosure, a communication node detects an intermediate potential between a pair of signal lines using an inter-line potential detector, and detects an intermediate potential of an operation power source voltage which is supplied to the communication node using a node potential detector. A voltage adjuster (8) detects a difference between the intermediate potential detected by the inter-line potential detector and the intermediate potential detected by the node potential detector, and adjusts the operation power source voltage in accordance with the difference.

The above system automatically adjusts the difference to be null even when the difference of the ground potential arises between the communication nodes in multiple communication nodes connected to the transmission line in an initial state. Accordingly, the level of the differential signal transmitted through the transmission line at each communication node is equalized, and therefore, the communication is surely performed.

BRIEF DESCRIPTION OF DRAWINGS

The above and other objects, features and advantages of the present disclosure will become more apparent from the following detailed description made with reference to the accompanying drawings.

EMBODIMENTS

First Embodiment

Figure 1:
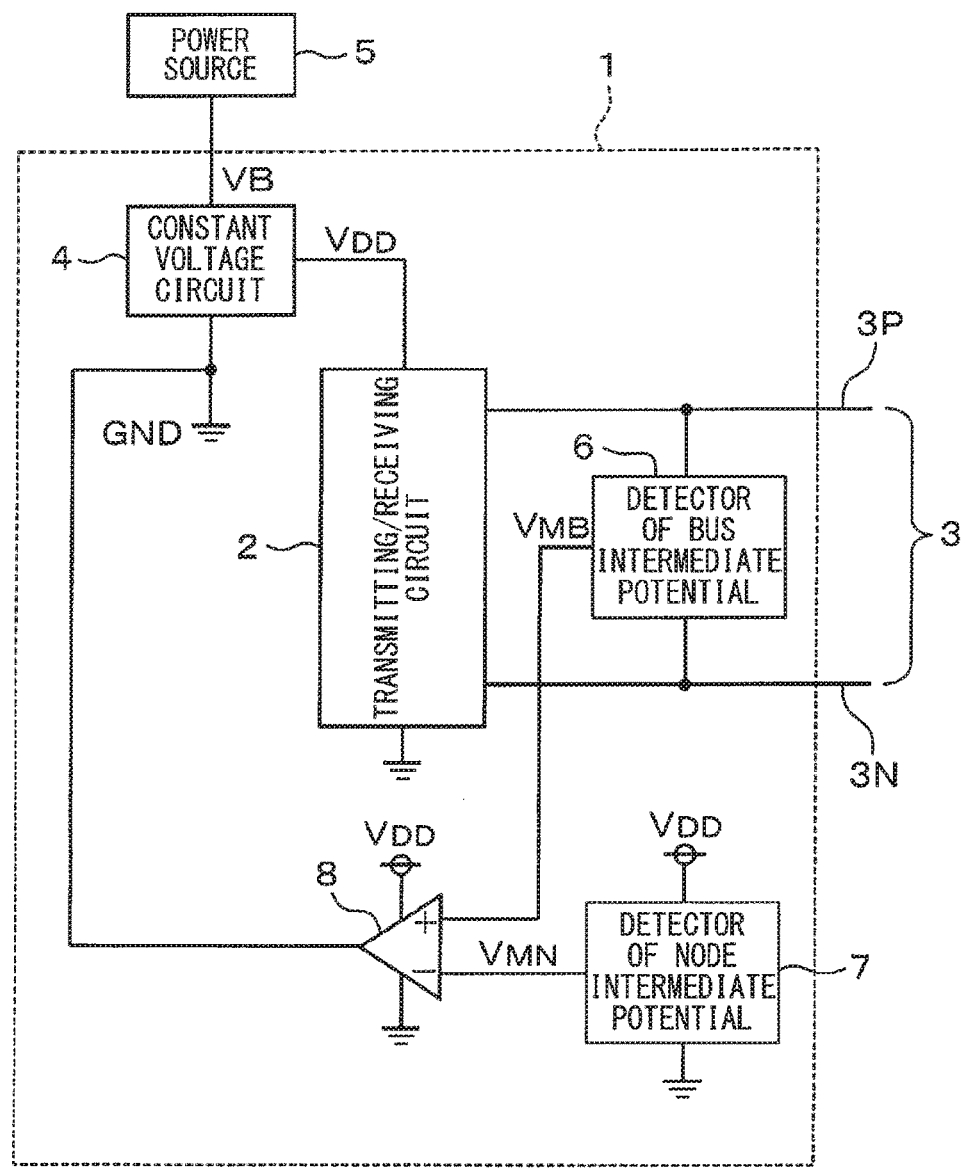
FIG. 1 is a block diagram showing a structure of a communication node according to a first embodiment.

As shown in FIG. 1, a transmitting and receiving circuit 2 equipped in a communication node 1 is connected to a transmission line 3 having a pair of signal lines, i.e., a high potential signal line 3P and a low potential signal line 3N. Here, a transmission circuit and/or a receiving circuit instead of the transmitting and receiving circuit 2. A power source voltage VB having a voltage of 12 volts is supplied from an external power source 5 to a constant voltage circuit 4. The constant voltage circuit 4 is provided by, for example, a band gap reference circuit and the like. The constant voltage circuit 4 generates an operation power source voltage VDD having a voltage of 5 volts according to the power source voltage VB, for example, and supplies to the transmitting and receiving circuit 2 and the like. The transmitting and receiving circuit 2 drives the transmission line 3 to transmit a differential signal to other communication nodes. Further, the transmitting and receiving circuit 2 receives the differential signal output from other communication nodes via the transmission line 3.

A bus intermediate potential detection circuit 6 is connected between the high potential signal line 3P and the low potential signal line 3N. The bus intermediate potential detection circuit 6 is also defined as an inter-line potential detection circuit or an inter-line potential detector. For example, the bus intermediate potential detection circuit 6 is provided by a voltage divider circuit having two resistors connected in series with each other, and detects an intermediate potential VMB between the lines 3P, 3N. The intermediate potential VMB is, for example, 2.5 volts as a standard value. When the transmission line 3 is in a non-drive state, each of the potential in the signal line 3P and the potential in the signal line 3N is the intermediate potential VMB. The intermediate potential VMB is changed at a receiving node according to the ground potential as a standard of the transmitting node for transmitting the differential signal.

A node intermediate potential detection circuit 7 (also defined as a subject node intermediate potential detection circuit) is connected between the power source voltage VDD and the ground GND of the communication node 1. Similarly, the node intermediate potential detection circuit 7 is provided by a voltage divider circuit having two resistors connected in series with each other, and detects an intermediate potential VMN of the operation power source voltage VDD of the communication node 1. The intermediate potential VMN is 2.5 volts with reference to the ground GND as a reference voltage. The node intermediate potential detection circuit 7 is also defined as a node potential detection circuit or a node potential detector.

The intermediate voltages VMB, VMN are input into a differential amplifier circuit 8, and an output terminal of the differential amplifier circuit 8 is connected to the ground GND. The differential amplifier circuit 8 is also defined as a voltage adjustment circuit or a voltage adjuster. The differential amplifier circuit 8 outputs a voltage in accordance with a difference between the intermediate voltages VMB, VMN, so that the differential amplifier circuit 8 adjusts a potential of the ground GND at the communication node itself.

Next, an operation of the present embodiment will be explained. For example, it is assumed such that the differential signal transmitted from another communication node not shown in the drawing is received by the communication node 1. In this case, when there is no potential difference between the ground potential of the other communication node and the potential of the ground GND of the communication node 1, the intermediate potential VMB with reference to the ground GND as the reference potential input into the differential amplifier circuit 8 is equal to the intermediate potential VMN. Accordingly, the output voltage of the differential amplifier circuit 8 is a zero level.

On the other hand, when there is a potential difference between the ground potential of the other communication node and the potential of the ground GND of the communication node 1, the intermediate potential VMB is not equal to the intermediate potential VMN. Thus, the output voltage of the differential amplifier circuit 8 is a certain level corresponding to the potential difference. Thus, the potential of the ground GND is adjusted. Thus, the operation power source voltage VDD output from the constant voltage circuit 4 always follows the ground potential difference. As a result, the potential of the ground GND is always adjusted to maintain an equal of VMB=VMN.

According to the present embodiment, the bus intermediate potential detection circuit 6 detects the intermediate potential VMB between the signal lines 3P, 3N. The node intermediate potential detection circuit 7 detects the intermediate potential VMN of the operation power source voltage supplied to the communication node itself. The differential amplifier circuit 8 detects the difference between the intermediate potentials VMN, VMN, and adjusts the operation power source voltage in accordance with the difference.

Specifically, the differential amplifier circuit 8 adjusts the ground potential of the constant voltage circuit 4 in accordance with the difference between the intermediate potentials VMB, VMN. Using this system, even when the difference of the ground potential arises between the communication nodes connected to the transmission line 3 in an initial state, the potential difference is automatically adjusted to be null. Accordingly, the level of the differential signal transmitted through the transmission line 3 at each communication node is equalized, and therefore, the communication is surely performed.

Second Embodiment

Figure 2:
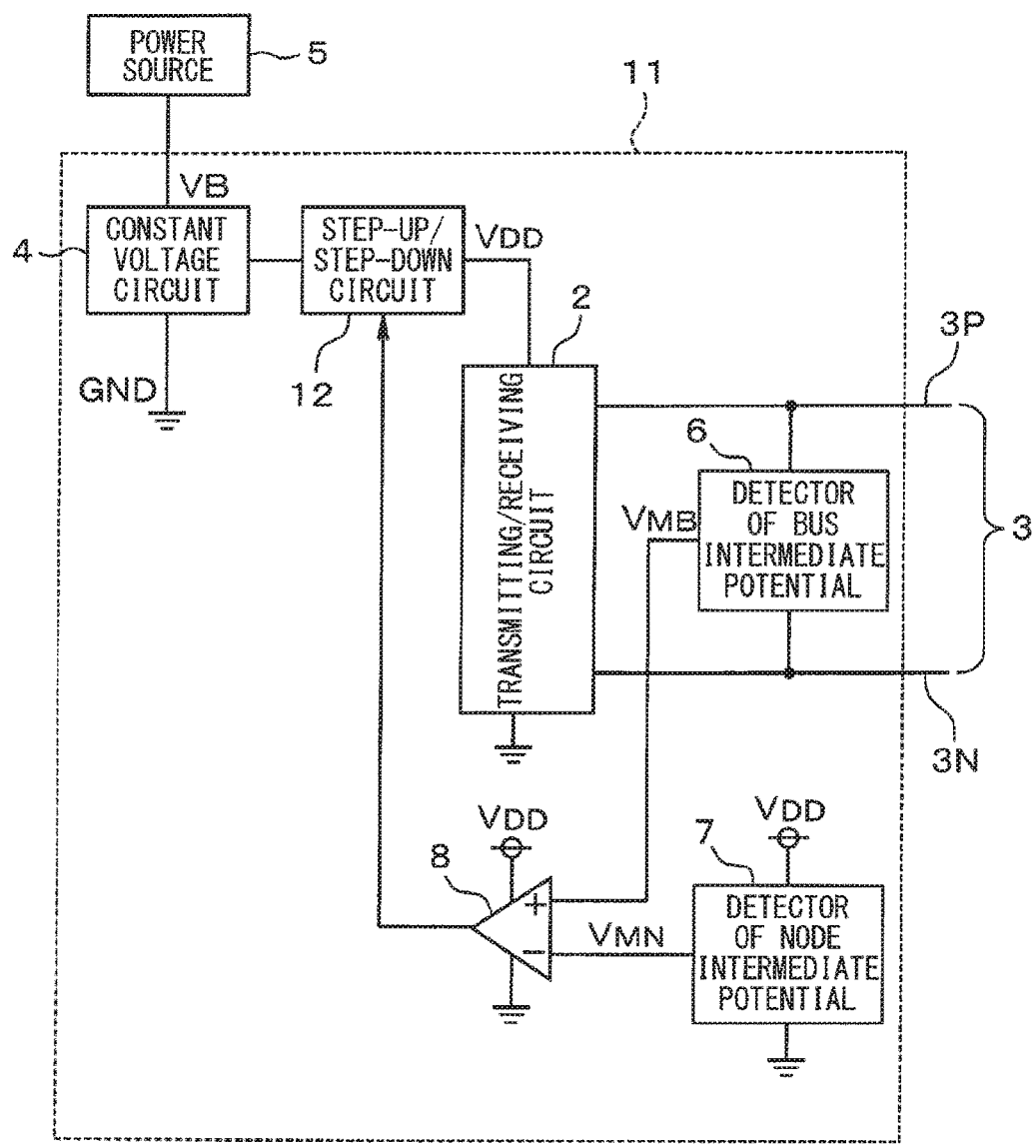
FIG. 2 is a block diagram showing a structure of a communication node according to a second embodiment.

The same reference numeral is assigned to the same part in the first embodiment, and the explanation of the same part is skipped. The different part will be explained. As shown in FIG. 2, the communication node 1 according to the second embodiment includes a step-up and step-down circuit 12 arranged on an output side of the constant voltage circuit 4. The step-up and step-down circuit 12 is provided by, for example, a charge pump circuit. The step-up and step-down circuit 12 generates the operation power source voltage VDD with or without stepping up or stepping down the output voltage of the constant voltage circuit 4, and supplies the operation power source voltage VDD to the transmitting and receiving circuit 2 and the like. The output voltage of the differential amplifier circuit 8 is input into the step-up and step-down circuit 12, so that the step-up rate or the step-down rate of the step-up and step-down circuit 12 is controlled according to the output voltage.

Thus, in the above system according to the second embodiment, the differential amplifier circuit 8 controls the step-up rate or the step-down rate of the step-up and step-down circuit 12 according to the difference between the intermediate potentials VMB, VMN, and therefore, similar effects of the first embodiment are obtained.

Third Embodiment

Figure 3:
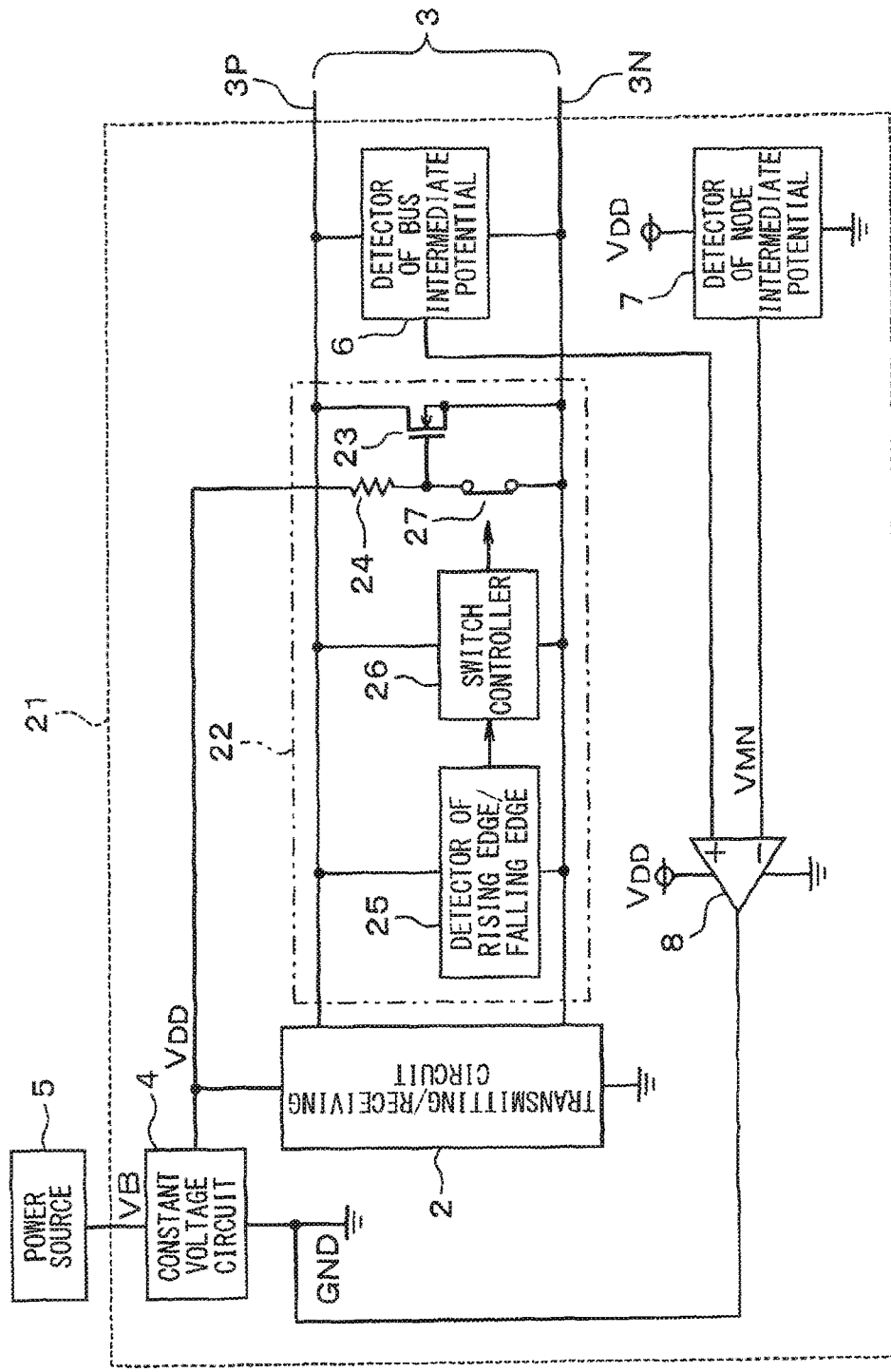
FIG. 3 is a block diagram showing a structure of a communication node according to a third embodiment.

As shown in FIG. 3, a communication node 21 according to the third embodiment includes a distortion restriction circuit 22 having a function for restricting a ringing generated in the transmission line 3 similar to the Patent Literature 1, for example, in addition to the communication node 1 of the first embodiment. The N channel MOSFET 23 (defined as a FET 23) as an inter-line switching element is connected between the high potential signal line 3P and the low potential signal line 3N. The gate of the FET 23 is pulled up to the power source voltage VDD via the resistor 24.

A detector 25 for a rising edge and a falling edge is also defined as a rising-edge and falling edge detector. The detector 25 is connected between the high potential signal line 3P and the low potential signal line 3N. When the detector 25 detects the rising edge or the falling edge of the differential signal transmitted via the transmission line 3, the detector 25 outputs a detection signal to a switch controlling unit 26 (also defined as a switch controller). A normally-off type switching circuit 27 is connected between the gate of the FET 23 and the low potential signal line 3N. The switch controller 26 controls the switching circuit 27 to turn on and off. The switching circuit 27 is provided by, for example, a MSFET similar to the Patent Literature 1. The rising edge and falling edge detector 25, the switch controller 26 and the switching circuit 27 are also defined as a switch control circuit or a switching control unit.

Next, an operation of the third embodiment will be explained. For example, when the distortion restriction circuit 22 functions similar to the Patent Literature 1, the rising-edge and falling edge detector 25 detects the falling edge of the level of the differential signal that changes from a high level to a low level, and then, outputs the detection signal. Then, the switching controller 26 controls the switching circuit 27 to turn off during only a predetermined period from that time so that the FET 23 is in the on state. Thus, the impedance between the signal lines 3P, 3N is reduced.

Accordingly, the ringing generated in a case where the differential signal level is changed from the high level to the low level is restricted.

Thus, in the third embodiment, the normally off type switching circuit 27 is connected between the gate of the FET 23 and the low potential signal line 3N. The switch controller 26 controls the switching circuit 27 to turn on and off, so that the impedance between the signal lines 3P, 3N is reduced. Thus, the ringing is restricted similar to the Patent Literature 1. Further, the restriction effect of the ringing is much improved by adjusting the ground potential difference between the communication nodes.

Fourth Embodiment

Figure 4:
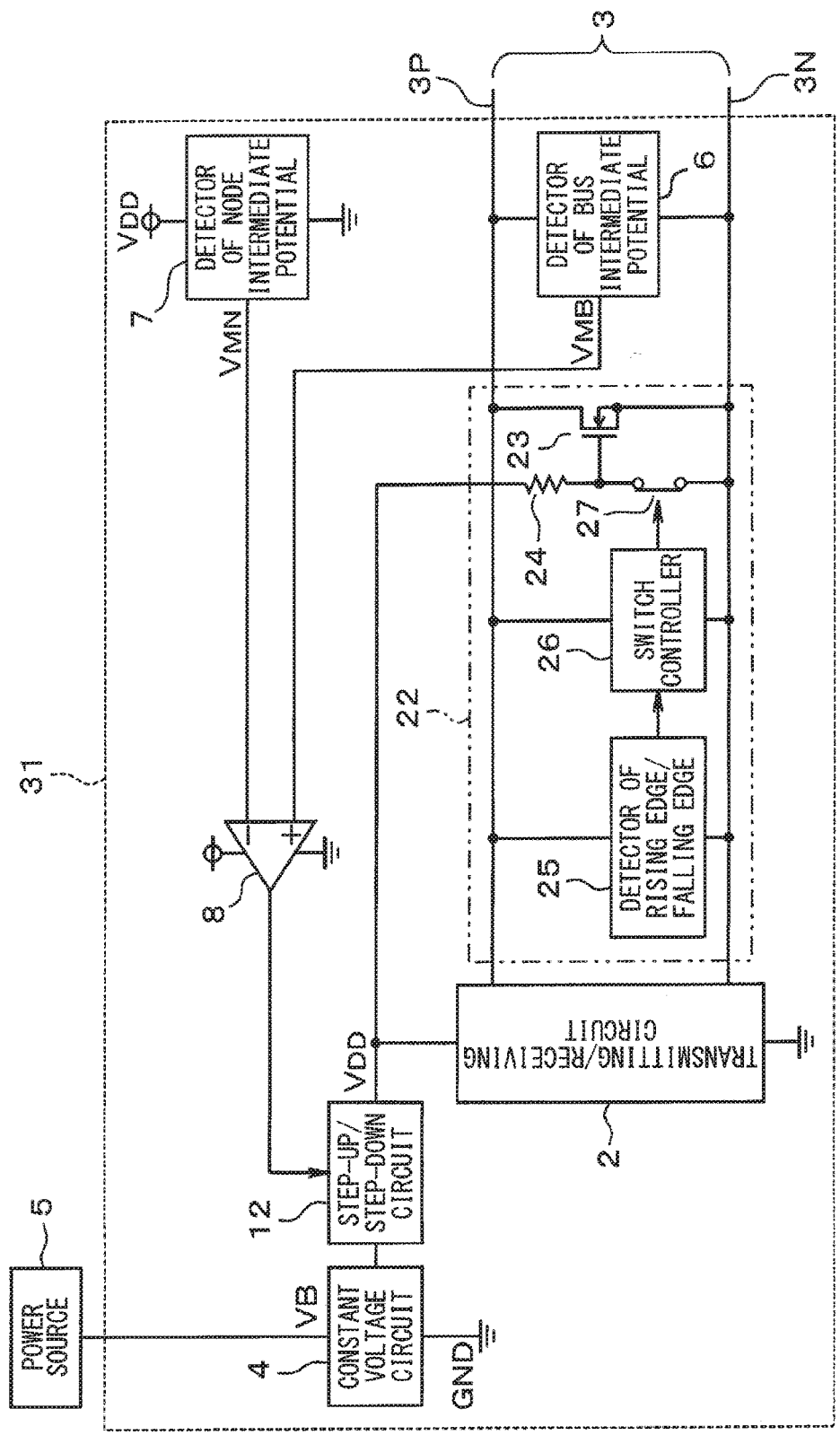
FIG. 4 is a block diagram showing a structure of a communication node according to a fourth embodiment.

As shown in FIG. 4, a communication node 31 according to a fourth embodiment includes the distortion restriction circuit 22 of the third embodiment in addition to the communication node 11 of the second embodiment. This system provides the similar effects of the third embodiment.

(Modifications)

The above disclosure can be modified or expand as follows.

The stepping-up corresponds to a feature such that the voltage amplification factor becomes larger than 1. The stepping-down corresponds to a feature such that the voltage amplification factor becomes smaller than 1. Accordingly, the step-up and step-down circuit may be provided by an amplifier circuit having a changeable amplification factor.

The inter-line switching element may be a P channel MOSFET, and the constitution similar to the Patent Literature 1 may be applied in accordance with the P channel MOSFET. Further, similar to the fifth embodiment of the Patent Literature 1, the inter-line switching element may be provided by the N channel MSFET and the P channel MOSFET which are connected in parallel to each other.

The power source voltage and the like may be changeable according to an individual design.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A communication node connected to a transmission line which transmits a differential signal changeable between a high level and a low level and has a high potential signal line and a low potential signal line as a pair of signal lines, the communication node comprising:
    an inter-line potential detector that detects an intermediate potential between the pair of signal lines;
    a node potential detector that detects an intermediate potential of an operation power source voltage which is supplied to the communication node;
    a voltage adjuster that detects a difference between the intermediate potential detected by the inter-line potential detector and the intermediate potential detected by the node potential detector, and adjusts the operation power source voltage to reduce the difference;
    an inter-line switching element connected between the pair of signal lines; and
    a switching controller that controls the inter-line switching element to turn on in order to reduce an impedance between the signal lines when a level of the differential signal is changed.

2. The communication node according to claim 1, further comprising:
    a constant voltage circuit that supplies the operation power source voltage, wherein:
    the voltage adjuster adjusts a reference potential of the constant voltage circuit in accordance with the difference between the intermediate potentials.

3. A communication node connected to a transmission line which transmits a differential signal changeable between a high level and a low level and has a high potential signal line and a low potential signal line as a pair of signal lines, the communication node comprising:
    an inter-line potential detector that detects an intermediate potential between the pair of signal lines;
    a node potential detector that detects an intermediate potential of an operation power source voltage which is supplied to the communication node;
    a voltage adjuster that detects a difference between the intermediate potential detected by the inter-line potential detector and the intermediate potential detected by the node potential detector, and adjusts the operation power source voltage to reduce the difference;
    a constant voltage circuit; and
    a step-up and step-down circuit that steps up or steps down an output voltage of the constant voltage circuit to supply the operation power source voltage, wherein:
    the voltage adjuster adjusts a step-up rate or a step-down rate of the step-up and step-down circuit in accordance with the difference between the intermediate potentials.

* * * * *